(12) United States Patent
Klammer et al.

(10) Patent No.: US 11,292,197 B2
(45) Date of Patent: Apr. 5, 2022

(54) DATA REPRESENTING A WEAR INDICATOR

(71) Applicant: HEWLETT-PACKARD DEVELOPMENT COMPANY, L.P., Houston, TX (US)

(72) Inventors: Peter J. Klammer, Corvallis, OR (US); Karl Walters, San Diego, CA (US); Peter Morovic, Sant Cugat del Valles (ES); Jan Morovic, Colchester (GB)

(73) Assignee: Hewlett-Packard Development Company, L.P., Spring, TX (US)

( * ) Notice: Subject to any disclaimer, the term of this patent is extended or adjusted under 35 U.S.C. 154(b) by 494 days.

(21) Appl. No.: 15/766,316

(22) PCT Filed: Jan. 28, 2016

(86) PCT No.: PCT/US2016/015379
§ 371 (c)(1),
(2) Date: Apr. 5, 2018

(87) PCT Pub. No.: WO2017/131702
PCT Pub. Date: Aug. 3, 2017

(65) Prior Publication Data
US 2018/0319086 A1 Nov. 8, 2018

(51) Int. Cl.
*B29C 64/393* (2017.01)
*B33Y 50/02* (2015.01)
(Continued)

(52) U.S. Cl.
CPC .......... *B29C 64/393* (2017.08); *B29C 64/112* (2017.08); *B29C 64/336* (2017.08);
(Continued)

(58) Field of Classification Search
USPC .......................................................... 703/5, 6
See application file for complete search history.

(56) References Cited

U.S. PATENT DOCUMENTS 5,109,282 A * 4/1992 Peli ...................... H04N 1/4051
358/3.14
6,118,935 A * 9/2000 Samworth .............. H04N 1/405
358/1.9
(Continued)

FOREIGN PATENT DOCUMENTS

CN 103582738 2/2014
EP 0234873 4/1993
(Continued)

OTHER PUBLICATIONS

Brunton, Pushing the Limits of 3D Color Printing: Error Diffusion with Translucent Materials, Dec. 2015, < https://arxiv.org/pdf/1506.02400.pdf >.
(Continued)

*Primary Examiner* — Thai Q Phan
(74) *Attorney, Agent, or Firm* — HP Inc. Patent Department (57) ABSTRACT

In some examples, a system generates three-dimensional (3D) object data for printing by a 3D printing system, the generating including determining a region in which to generate a wear indicator, and computing an arrangement of spatial shells of variable thickness in the region, where the spatial shells contain data representing at least one property of the wear indicator.

20 Claims, 4 Drawing Sheets

(51) Int. Cl.
*B33Y 40/00* (2020.01)
*B29C 64/112* (2017.01)
*B29C 64/336* (2017.01)
*B29C 64/386* (2017.01)
*G06K 19/06* (2006.01)
*B33Y 30/00* (2015.01)
*B33Y 10/00* (2015.01)
*G06F 30/00* (2020.01)

(52) U.S. Cl.
CPC ............ *B29C 64/386* (2017.08); *B33Y 40/00* (2014.12); *B33Y 50/02* (2014.12); *G06K 19/06159* (2013.01); *B33Y 10/00* (2014.12); *B33Y 30/00* (2014.12); *G06F 30/00* (2020.01)

(56) References Cited

U.S. PATENT DOCUMENTS

| | | | | |
|---|---|---|---|---|
| 6,127,990 | A * | 10/2000 | Zwern | G09B 9/00 345/158 |
| 6,556,798 | B2 * | 4/2003 | Rimai | G03G 15/2064 399/167 |
| 7,070,110 | B2 * | 7/2006 | Lapstun | G06F 3/014 235/462.45 |
| 7,543,399 | B2 * | 6/2009 | Kilgore | A43B 3/24 36/101 |
| 7,589,868 | B2 * | 9/2009 | Velde | B41C 1/00 358/3.3 |
| 7,784,508 | B2 | 8/2010 | Kemp et al. | |
| 8,442,665 | B2 | 5/2013 | Krause | |
| 8,789,253 | B2 * | 7/2014 | Kilgore | A43B 3/24 29/401.1 |
| 8,874,248 | B2 | 10/2014 | Young et al. | |
| 9,022,143 | B2 | 5/2015 | Dupont et al. | |
| 9,663,693 | B2 * | 5/2017 | Bock | C09K 3/1436 |
| 9,908,293 | B2 * | 3/2018 | Yoo | B33Y 40/00 |
| 10,225,438 | B2 * | 3/2019 | Morovic | B29C 64/393 |
| 2002/0114642 | A1 * | 8/2002 | Rimai | B65H 29/12 399/167 |
| 2003/0025749 | A1 * | 2/2003 | Krouss | H04N 1/405 347/15 |
| 2003/0228158 | A1 * | 12/2003 | Smith | G03G 15/75 399/26 |
| 2004/0183796 | A1 * | 9/2004 | Velde | B29C 64/40 345/419 |
| 2006/0185255 | A1 | 8/2006 | Nevoret | |
| 2006/0214000 | A1 * | 9/2006 | Lapstun | G06Q 30/0212 235/462.44 |
| 2007/0088442 | A1 | 4/2007 | Cima et al. | |
| 2008/0131146 | A1 * | 6/2008 | Kendall | G03G 15/553 399/27 |
| 2009/0195845 | A1 * | 8/2009 | Hoshii | H04N 1/6033 358/518 |
| 2010/0195122 | A1 * | 8/2010 | Kritchman | B41M 7/0027 358/1.9 |
| 2011/0096388 | A1 * | 4/2011 | Agrawal | G02F 1/155 359/268 |
| 2011/0157291 | A1 * | 6/2011 | Crockett | B41J 2/3353 347/206 |
| 2012/0285226 | A1 * | 11/2012 | Laurer | F01D 5/12 73/86 |
| 2014/0204114 | A1 * | 7/2014 | Zeng | G09G 3/2066 345/598 |
| 2014/0265538 | A1 * | 9/2014 | Brady | B60B 7/0006 301/95.101 |
| 2015/0258770 | A1 | 6/2015 | Chen | |
| 2015/0269468 | A1 | 9/2015 | Butz | |
| 2015/0287247 | A1 | 10/2015 | Willis et al. | |
| 2015/0359324 | A1 * | 12/2015 | Brewer | A47K 7/04 15/22.1 |
| 2016/0259306 | A1 * | 9/2016 | Pangrazio, III | H04L 9/3247 |
| 2017/0119144 | A1 * | 5/2017 | Brewer | A46B 13/008 |
| 2017/0210548 | A1 * | 7/2017 | Matos Rodriguez | B65D 81/133 |
| 2018/0139349 | A1 * | 5/2018 | Morovic | H04N 1/32149 |
| 2018/0239567 | A1 * | 8/2018 | Morovic | G06K 15/18 |

FOREIGN PATENT DOCUMENTS

| | | |
|---|---|---|
| JP | 2011105915 | 6/2011 |
| JP | 2015229270 | 12/2015 |
| KR | 1020070108378 | 9/2009 |
| WO | WO-2015-088832 | 6/2015 |
| WO | WO-2015111059 | 7/2015 |
| WO | WO-2016119860 | 8/2016 |
| WO | WO-2016169613 | 10/2016 |
| WO | WO-2017074447 | 5/2017 |

OTHER PUBLICATIONS

Meng et al; "Tool Wear Monitoring of Wiper Inserts in Multi-Insert Face Milling Using Three-Dimensional Surface Form Indicators"; Feb. 18, 2015; http://manufacturingscience.asmedigitalcollection.asme.org/article.asme.org/article.aspx?articleid=1920453.

* cited by examiner

DATA REPRESENTING A WEAR INDICATOR

BACKGROUND

Wear indicators can be used in mechanical components that are subject to wear caused by abrasion or other physical interactions. As a mechanical component is used, the wear on a surface of the mechanical component can cause portions of the surface to erode or deform. With the erosion or deformation of surface portions of the mechanical component, a wear indicator of the mechanical component can be exposed to indicate that the mechanical component should be replaced or repaired.

BRIEF DESCRIPTION OF THE DRAWINGS

Some implementations of the present disclosure are described with respect to the following figures.

DETAILED DESCRIPTION

Some techniques of forming wear indicators on mechanical components use traditional manufacturing processes, which can include some combination of the following steps: injection molding, lamination, machining, and so forth. With traditional manufacturing processes, it can be difficult to access internal parts of mechanical components to build wear indicators on the mechanical components. Moreover, traditional manufacturing processes may be restricted in the geometries and shapes of wear indicators that can be formed.

In accordance with some examples of the present disclosure, a three-dimensional (3D) printing process is used to form a wear indicator on a mechanical component. Examples of mechanical components include a brake pad, a tire tread wear bar, a sprocket or gear tooth, a cam surface, a sole of a shoe, or any other item that is subject to erosion or deformation with use.

A 3D printing process is also referred to as an additive manufacturing (AM) process, in which successive layers of material(s) of a 3D object are formed under control of a computer based on a 3D model or other electronic representation of the object. The layers of the object are successively added until the entire 3D object is formed.

Figure 1:
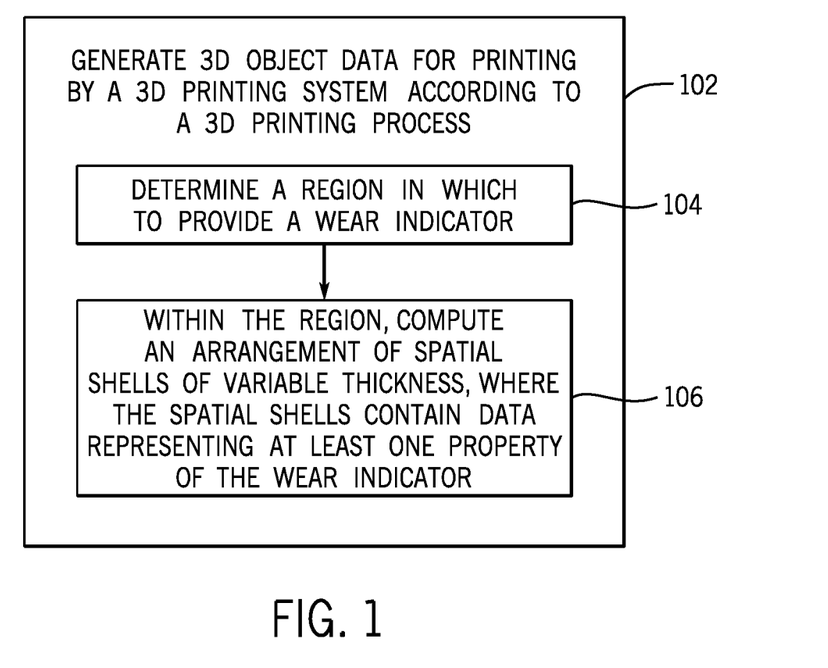
FIG. 1 is a flow diagram of an example process of generating a three-dimensional (3D) object data that includes a wear indicator, according to some examples.

In some examples of the present disclosure, a 3D printing system prints a 3D object according to a 3D printing process that uses 3D object data (also referred to as a 3D object model) that is derived based on associating the original 3D object data (the 3D model of the original 3D object without the wear indicator) and input information relating to the wear indicator. As shown in FIG. 1, an example process (which can be performed by a computing system) of generating (at 102) 3D object data (3D object model) including a wear indicator for printing by a 3D printing system according to a 3D printing process includes determining (at 104) a region of the original 3D object (that is without a built-in wear indicator) in which to add a wear indicator, and within this region, computing (at 106) an arrangement of spatial shells of variable thickness, where the spatial shells contain data representing at least one property of the wear indicator. Note that at least some of the spatial shells can further include data representing at least one property of a portion of the original 3D object.

In the present disclosure, reference to generating 3D object data of a 3D object that includes "a" wear indicator is a reference to generating 3D object data of the 3D object that includes one or multiple wear indicators.

Each spatial shell has a respective thickness, and can represent a corresponding level or layer of the region of the 3D object in which the wear indicator is to be formed. A shell can have any shape, and does not have to conform to the shape of the outer profile of the 3D object. A spatial shell contains data representing at least one property (e.g. an optical property, a mechanical property, and/or other property) of a portion of the 3D object in a spatial volume represented by the spatial shell. More generally, shells can include respective combinations of different properties that can be set based on desired characteristic(s) of the wear indicator. In some examples, at least one portion of a shell can correspond to at least one property of a wear indicator, and a different portion of the shell can correspond to at least one property of the original 3D object.

More specifically, the spatial shell (or more simply "shell") represents a shell portion of a 3D object that corresponds to a portion of the 3D object that is closest to the outer surface of the 3D object. Object data representing the 3D object can be received by a 3D printing system. Based on the object data, the 3D printing system is able to deposit successive layers of the 3D object (using respective combinations of one or multiple materials) onto a substrate to build the 3D object. The received object data can include shell data that corresponds to the shell of the 3D object, and core data that corresponds to a core of the 3D object.

Figure 2:
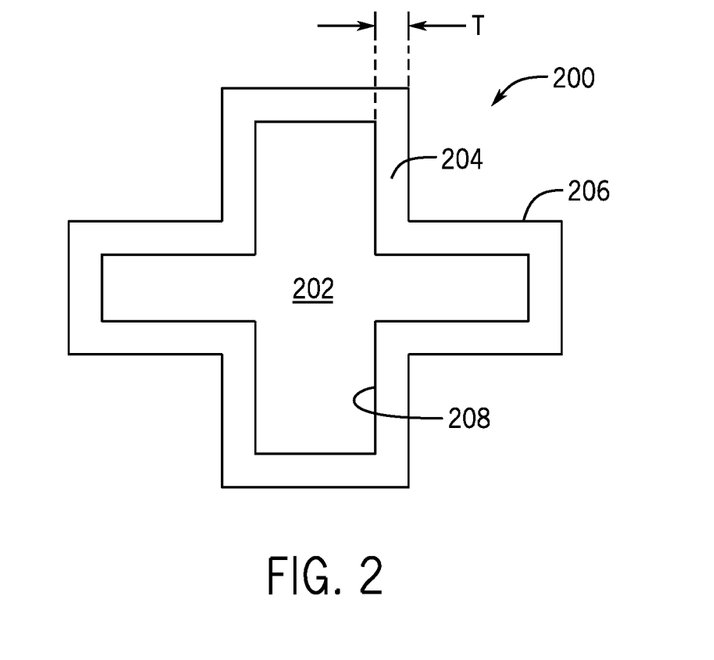
FIGS. 2 and 3 are schematic diagrams of a 3D object model including a core and a shell that defines a region containing a wear indicator, according to some examples.

FIG. 2 is a schematic diagram illustrating a cross section of 3D object data 200 (a 3D object model) that includes a core 202 and a shell 204 (that includes data representing at least one property of a wear indicator) that surrounds the core 202. In other examples, the shell 204 can have a different shape, and does not have to conform to the outer profile of the core 202. The cross section represented by FIG. 2 can correspond to a layer (or slice) of the 3D object model 200. The shell 204 has a specified thickness T, and is the portion of the 3D object model 200 that is closest to an outer surface 206 of the 3D object model 200. In some examples, the shell 204 corresponds to locations of the 3D object model 200 that impact the appearance of the surface of the 3D object model 200, including regions that include wear indicators. Although the shell 204 is depicted as having uniform thickness T outside (e.g. around) the core 202, it is noted that in other examples, the thickness of the shell 204 can be irregular.

The core 202 is contained within a profile defined by an inner surface 208 of the shell 204. The core 202 includes locations within the 3D object model 200 away from the outer surface 206 of the 3D object model 200 and contained within the inner surface 208 of the shell 204

The shell data is an electronic data representation of at least one property of the shell 204. The core data is an electronic data representation of at least one property in the core 202.

Figure 3:
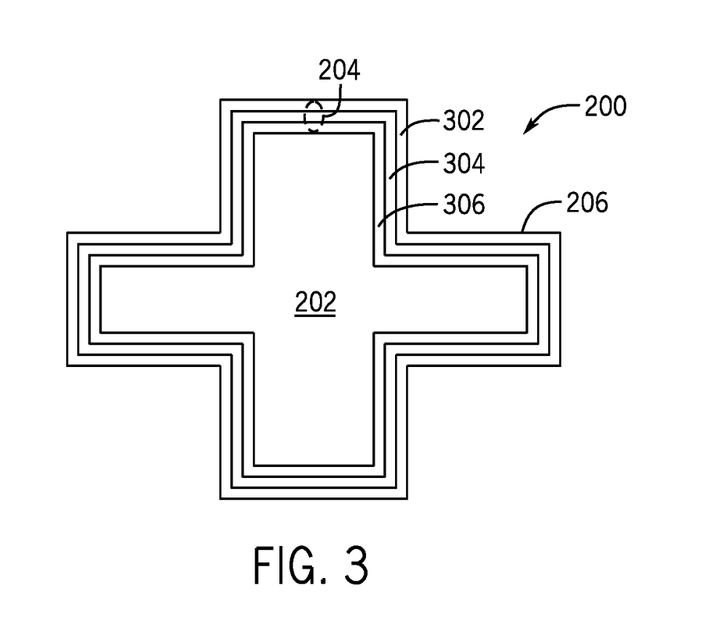

FIG. 3 shows an arrangement (e.g. a sequence) of shells 302, 304, and 306. In the example of FIG. 2, the shells 302, 304, and 306 are nested within the shell 204, such that a sequence of nested shells are provided. Although FIG. 3 shows the shells 302, 304, and 306 as being nested within the shell 206, it is noted that in other examples, the shells 302, 304, and 306 are not nested shells. For example, the shells can be provided at different locations of the 3D object, rather than at different depths.

Each shell 302, 304, or 306 can represent a respective different level of the shell portion of the 3D object model 200. For example, the shell 302 can represent level 1, the shell 304 can represent level 2, and the shell 306 can represent level 3, where different levels can correspond to different property values of a wear indicator that is included within a region defined by the shells 302, 304, and 306. Although FIG. 3 shows three shell 302, 304, and 306 corresponding to three different levels, it is noted that less than three shells or more than three shells can be provided in other examples.

Level 1 represented by the shell 302 is the portion of the 3D object model 200 closest to the outer surface 206 of the 3D object model 200. Level 2 represented by the shell 304 is the portion of the 3D object that is farther away from the outer surface 206 than the portion represented by the shell 302, and level 3 represented by the shell 306 is the portion of the 3D object that is farther away from the outer surface 206 than the portion represented by the shell 304. The shells 302, 304, and 306 can represent respective portions of the 3D object at increasing depths into the 3D object model 200, or equivalently, at increasing distances from the outer surface 206.

The different levels can correspond to different values of at least one property of a wear indicator provided in the 3D object model 200. For example, if the property of the wear indicator is color, then the different levels represented by the shells 302, 304, and 306 can correspond to different colors. More generally, the at least one property of a wear indicator can include any or some combination of the following: a color (different levels have different wear indicator colors), a shape (different levels have different wear indicator shapes), an indicator label (different levels have different indicator labels, such as different text or other labels), a texture (different levels have different wear indicator textures), a conductive characteristic (different levels have different electrical conductivities of the wear indicator), a magnetic characteristic (different levels have different magnetic field strengths of the wear indicator), an acoustic characteristic (different levels of the wear indicator emanate different sounds), an elastic characteristic (different levels have different wear indicator elasticity), a chemical characteristic (different levels have different chemical compounds), and so forth.

Although reference is made to assigning different property values of the wear indicator to different levels, it is noted that in other examples, different property values of the wear indicator can additionally be assigned to different locations within the 3D object.

In some examples, as erosion of the outer surface 206 of the 3D object occurs due to wear, different characteristics of the wear indicator are exposed, including characteristics represented by any or some combination of the foregoing wear indicator properties.

In examples where the property of the wear indicator is a conductive characteristic, electrical elements (e.g. electrically conductive traces or wires, sensors, etc.) can be formed in one or multiple levels of the different levels represented by the shells 302, 304, and 306. For example, in the absence of wear, an electrically conductive trace or wire is not exposed, such that a first conductivity is exhibited by the wear indicator. However, as erosion occurs with wear, the electrically conductive trace or wire can be exposed to either make or break a circuit, such that a different conductivity is exhibited by the wear indicator.

In further examples, a wear indicator can provide different chemical characteristics at different levels. For example, at a first level, the wear indicator has a first chemical characteristic (e.g. it is a solid). After wear causes a portion of the 3D object to be eroded such that a second level is reached, a specified chemical compound can be released, such as a specified fluid or a gas. For example, chambers can be formed in some respective shells below the outer surface of the 3D object, and the chambers can contain corresponding chemical compounds. As wear causes outer portions of the 3D object to erode, the chambers can successively be exposed to release the respective compounds.

Generally, properties of the wear indicator can change with heat, abrasion, chemical exposure, light exposure, electrical exposure, and/or any other reaction due to use of the 3D object.

In some examples, within each of the shells 302, 304, and 306, further sub-shells can be defined that correspond to different layers within the level represented by the respective shell 302, 304, or 306. For example, the shell 302 can include five layers (represented by five sub-shells within the shell 302), the shell 304 can include eight layers (represented by eight sub-shells within the shell 304), and the shell 306 can include three layers (represented by three respective sub-shells within the shell 306). Although example numbers of layers are referred to in the foregoing discussion, it is noted that in other examples, each level can include a different number of shell layers (including one layer or more than one layer). In examples where each level includes just one layer, the terms "level" and "layer" can be used interchangeably.

In some examples, "breakpoints" can be defined within the shell 204. A "breakpoint" can refer to a given depth (or distance from the outer surface 206) of the 3D object model 200 where a property (or a combination of properties) of a wear indicator in the shell 204 changes. For example, the property can be a color. Initially, the outer surface 206 of the 3D object model 200 can have a first color (e.g. green), corresponding to the shell 302, to indicate no wear or acceptable wear of the 3D object model 200. As erosion of the outer surface 206 occurs and the outermost portion of the 3D object model 200 (corresponding to the shell 302) is removed due to wear, a breakpoint is reached where the property (e.g. color) changes within the shell 204, such as to yellow to provide a warning that a certain amount of wear has occurred. This can correspond to the shell 304. As further erosion occurs, the next breakpoint is reached, and the portion of the shell 204 corresponding to the level 3 (shell 306) is reached. The shell 306 can have a different property, such as a different color (e.g. red), to indicate a condition where the 3D object has deteriorated such that the 3D object should be repaired or replaced.

As noted above, to generate a 3D object model that includes a wear indicator, the original 3D object model of the original 3D object can be associated with input information relating to the wear indicator. In some examples, the input information can include a specification of a wear profile of a 3D object, and a definition of a wear indicator pattern. The specification of the wear profile can specify the depth and/or positions in the 3D object that correspond to different wear indicator properties. For example, the specification of the wear profile can identify the different levels as represented in FIG. 2 of a shell, where each level can correspond to a respective nested shell. The specification of the wear profile can further specify that within each level, different breakpoints can correspond to different layers within the level.

The definition of the wear indicator pattern can specify the property, or combination of properties, of the wear indicator within each level and/or layer of the shell. For example, different levels and/or different layers can correspond to different colors and/or other properties.

In other examples, the specification of the wear profile and the definition of the wear indicator pattern can be combined in one data structure, such as in the form of a table that includes information pertaining to different levels and/or layers of the shell, and respective property values or combinations of values of properties, for the different levels and/or layers. The information in the specification of the wear profile and the definition of the wear indicator pattern can be determined using offline characterization of a 3D object, which can be based on user input or automated calculations performed outside of a printing system.

Figure 4:
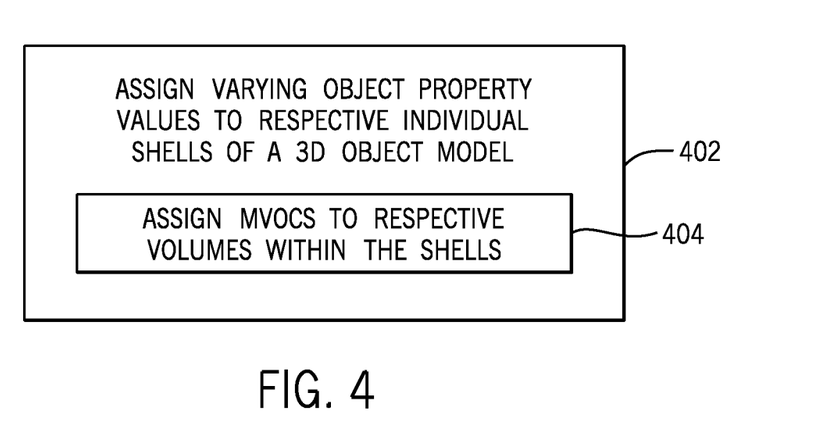
FIG. 4 is a flow diagram of an example process according to further examples.

FIG. 4 is a flow diagram of an example process according to further implementations that is part of generating a 3D object model including a wear indicator. The process of FIG. 4 can be performed by a computing system. The process of FIG. 4 includes assigning (at 402) varying object property values to respective individual shells of a 3D object model, such as those shown in FIG. 3. The assigning of the varying object property values includes combining values of one or multiple properties associated with a wear indicator and additional information provided by the shell data, including distance and/or index values. Each shell can be associated with a respective distance (e.g. depth) from the outer surface 206 of the 3D object model 200. Alternatively, each shell can be associated with a respective different index value, where different index values can identify different levels or layers.

In some examples, the assigning (at 402) of varying object property values can include assigning (at 404) material volume coverages (Mvocs) to respective volumes within the shells according to a lookup table (or other mapping data structure), [object properties→Mvocs], that maps object property values to Mvocs.

A 3D object can be represented by a three-dimensional array of unit volumes referred to herein as voxels, in a similar manner to the way in which a two-dimensional image is divided into unit areas referred to as pixels. An Mvoc representation is provided for each voxel. In some examples, the voxels can have a common shape, e.g. the voxels can share the same volume defined by the same height, width, and depth. In other examples, different voxels can have different cubic volumes or can have other custom-defined three-dimensional shapes.

The Mvoc representation for a voxel can be in the form of an Mvoc vector representing a probabilistic distribution of materials available to a 3D printing system for production of a 3D object. The probabilistic distribution can relate to different combinations of print materials, e.g. build material, finishing material, etc., including separate use of materials, joint use of materials, and an absence of any materials.

To explain the components of an Mvoc vector, a simple example may be considered. In this simple example, a printing system is arranged to use two materials (M1 and M2) to generate a 3D object. The materials can be fluid build materials that are deposited on a substrate, or the materials can include depositable agents that are deposited on one or multiple layers of build material. In some examples, these materials can include combinations of at least one of agents, inks and powdered build materials. If the printing system is arranged to deposit discrete amounts of each material, e.g. in binary deposits, there are four different material combination states: a first state for the deposit of M1 without M2; a second state for the deposit of M2 without M1; a third state for the deposit of both M1 and M2, e.g. M2 deposited over M1 or vice versa; and a fourth state for an absence of both M1 and M2, e.g. "blank" (Z) or an inhibitor. In this case, an Mvoc vector has four vector components that correspond to the four respective states: [M1, M2, M1M2, Z].

Each voxel thus has an Mvoc vector of this form. In the case of the last vector component, "blank" or "Z" may represent "empty" or an absence of materials in a processed layer, e.g. if agents are deposited on layers of build material this may denote an absence of build material for the processed layer, even though the build material may not be removed until the complete object has been produced.

More generally, for a printing system having k available materials and L discrete deposit states for the materials, an Mvoc vector includes $L^k$ vector components, where each vector component represents an available material/deposit state combination, including separate and joint use of the materials and/or an absence of any material. Stated differently, the vector components of an Mvoc vector represent all materials and their combinations available to the printing system, and the vector components provide an enumeration of possible build or deposit states available to the printing system. These states can be referred to as "material primaries." As such the Mvoc vector has a dimensionality representation of these states and contains the volume coverages (e.g. probabilities) associated with each state. An Mvoc vector includes weighted combinations or probabilities of material primaries.

In some examples, the characteristics of a wear indicator (one or multiple wear indicators) for a 3D object can be user-selected using an application program, such as a computer-aided design (CAD) application program or other application program. The user selection of the characteristics of a wear indicator can be based on property objects that can be presented to the user, where each property object including an object attribute description of a property (or properties) that can be achieved by a printing system. The user can choose between different property objects, or alternatively, the user can specify values of a property associated with a wear indicator.

Figure 5:
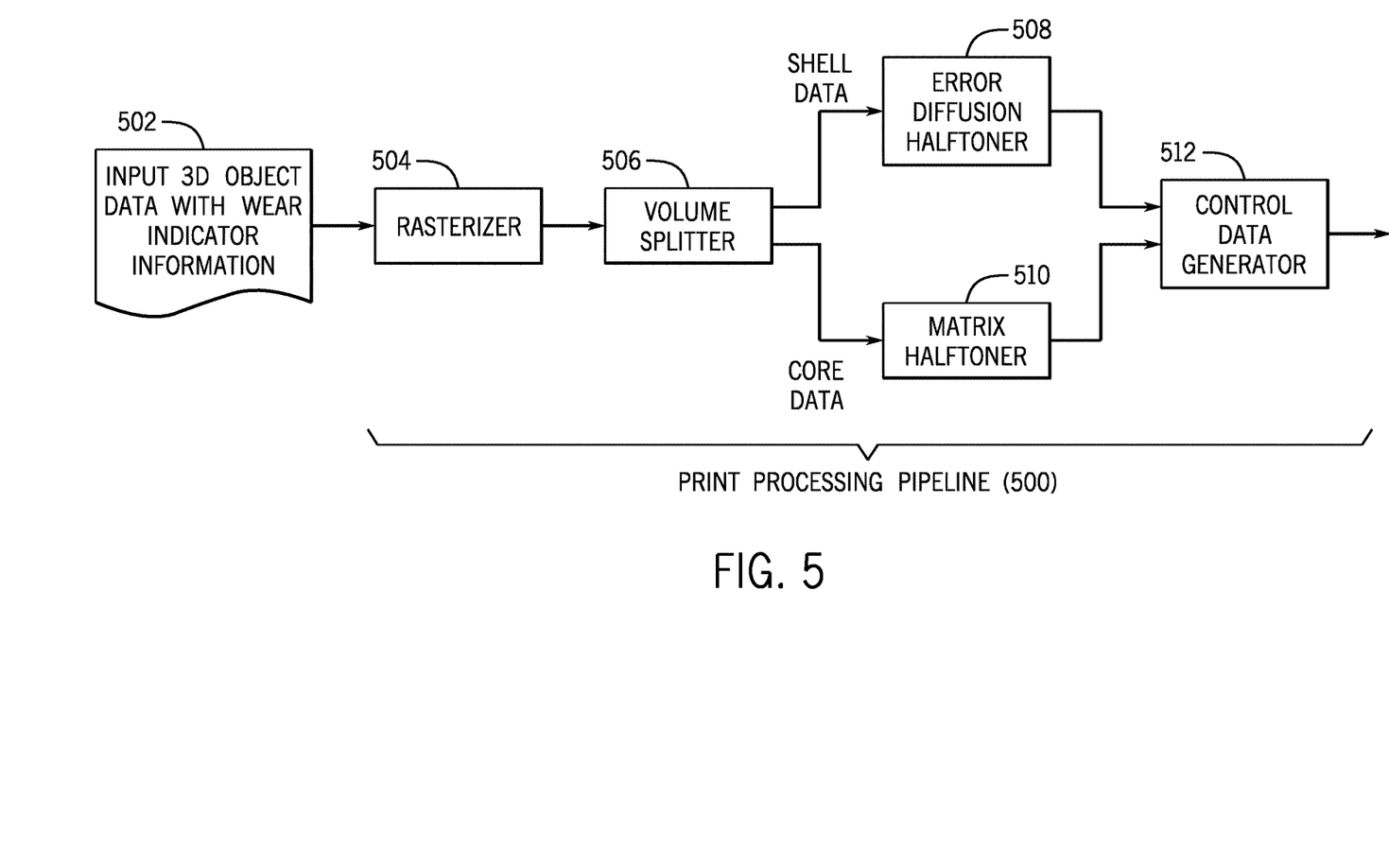
FIG. 5 is a block diagram of a print processing pipeline to process input 3D object data including wear indicator information, according to some implementations.

FIG. 5 illustrates schematically an example of a print processing pipeline 500 of a 3D printing system for printing a 3D object according to a 3D printing process. The print processing pipeline 500 receives input 3D object data 502 (3D object model) that includes wear indicator information, including the shell data discussed above. The print processing pipeline 500 converts the input 3D object data 502 into control instructions for a 3D printing system. The input 3D object data 502 is received by a rasterizer 504, which processes the input 3D object data 502 into a raster-based format in some examples. In the raster-based format, the 3D object is represented by a 3D array of voxels. As explained above, the voxels can be assigned respective Mvoc vectors.

In some implementations, the print processing pipeline 500 can perform halftoning of the data from the rasterizer 504. The halftoning generates control instructions for printing the 3D object at respective print locations. In some examples, various different halftoning techniques may be used; e.g., a first halftoning technique can be used for the shell data while a second, different halftoning technique may be used for core data.

As an example, the shell data for a 3D object can be processed using error diffusion halftoning to produce control instructions for the shell of the 3D object to mitigate the impact of any difference between the object data and the printed output resulting from the 3D printing system being unable to provide an exact reproduction of the source content data. The core data can be processed using matrix halftoning to produce control instructions for the core of the 3D object. The matrix halftoning is computationally cheap and fast in comparison with the error diffusion halftoning, while the error diffusion halftoning provides a more accurate representation of the source object data. In this way, a 3D object is produced having higher levels of both spatial and visual detail at the surface of the 3D object as compared to applying matrix halftoning to the entirety of the object data, while also being computationally cheaper and faster as compared to applying error diffusion halftoning to the entirety of the object data.

In other examples, the same halftoning technique can be applied to both the shell and the core of the 3D object.

In examples where different halftoning techniques are applied to the shell and the core of the 3D object, the data output of the rasterizer 504 can be provided as an input to a volume splitter 506, which processes the data output by the rasterizer 504 to determine shell data corresponding to a shell of the 3D object, and core data corresponding to a core of the 3D object, as discussed above. In some examples, the volume splitter 506 outputs the shell data to an error diffusion halftoner 508, to perform error diffusion halftoning to the shell data to generate control instructions for a 3D printing system to produce the shell of the 3D object. The volume splitter 506 outputs the core data to a matrix halftoner 510, which applies matrix halftoning to the core data to generate control instructions for the 3D printing system to produce the core portion of the 3D object. The control instructions output by the error diffusion halftoner 508 and the control instructions output by the matrix halftoner 510 are input to a control data generator 512 to generate control instructions for the 3D printing system to reproduce the 3D object corresponding to the input 3D object data 502.

In some examples, the halftoning that is performed by the print processing pipeline is applied to the Mvoc vectors that correspond to respective voxels of the 3D object. The halftoning selects a specific state of the multiple states represented by each Mvoc vector (the specific state corresponds to a specific combination of materials or absence of materials as discussed above) for each voxel, and the 3D printing for each voxel proceeds according to the selected Mvoc vector state.

The control instructions output by the control data generator 512 is provided to a print device to print the 3D object according to the control instructions.

By using a 3D printing process to generate a wear indicator of any arbitrary geometric shape, the location (depth or other location) and property (or combination of properties) of the wear indicator at different locations of a 3D object can be more precisely controlled. The property (properties) of the wear indicator can be modulated at different levels and/or at different locations of the 3D object, such that different property values of the wear indicator can be specified for different levels and/or locations so that indications of wear can be provided.

Figure 6:
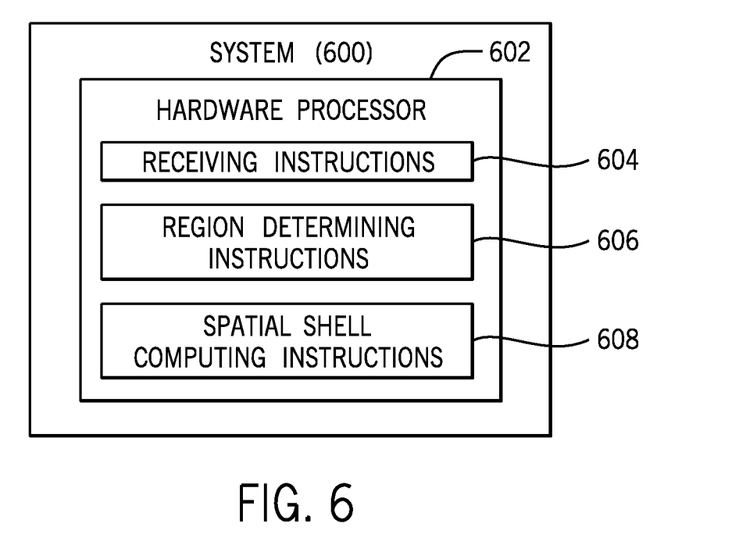
FIG. 6 is a block diagram of a 3D printing system including a print processing pipeline to process input 3D object data including wear indicator information, according to some implementations.

FIG. 6 is a block diagram of an example system 600 (e.g. a computer or a distributed arrangement of computers) according to some implementations. The system 600 includes a hardware processor 602 (or multiple hardware processors). A hardware processor can include a microprocessor, a core of a multi-core microprocessor, a microcontroller, a programmable integrated circuit, a programmable gate array, or other hardware processing circuit.

The hardware processor 602 can execute machine-readable instructions to perform tasks as discussed in the present disclosure. More specifically, the hardware processor 602 can execute receiving instructions 604 to receive an input 3D object model that is without a wear indicator, region determining instructions 606 to determine a region of the input 3D object model in which to add the wear indicator, and spatial shell computing instructions 608 to compute an arrangement of spatial shells of variable thickness in the region, where the spatial shells contain data representing at least one property of the wear indicator.

Figure 7:
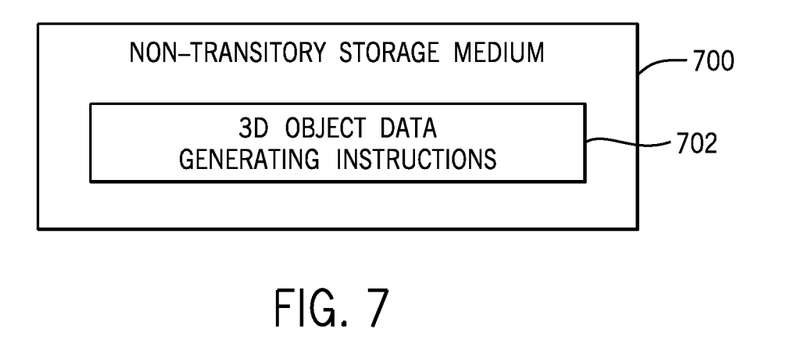
FIG. 7 is a block diagram of a non-transitory storage medium storing instructions to generate 3D object data that includes a wear indicator, according to some implementations.

FIG. 7 is a block diagram of an example non-transitory machine-readable or computer-readable storage medium 700 (one storage medium or multiple storage media). The storage medium 700 stores 3D object data generating instructions 702 that upon execution by a computing system (a computer or a distributed arrangement of computers) cause execution of various tasks, including those discussed above (e.g. the tasks of FIG. 1 or 4). More specifically, in some examples, the 3D object data generating instructions 702 upon execution cause the computing system to generate 3D object data for printing by a 3D printing system, the generating including computing an arrangement of spatial shells of variable thickness in a region of the 3D object data, where the spatial shells contain data representing at least one property of a wear indicator to be included in a 3D object produced by the 3D printing system, and assigning values of the at least one property to the spatial shells to define different characteristics of the wear indicator at different portions of the 3D object.

The storage medium 700 can include one or multiple different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A method comprising:
generating, by a system comprising a processor, three-dimensional (3D) object data for printing by a 3D printing system, the generating comprising:
determining a region in which to generate a wear indicator, and
computing an arrangement of spatial shells of variable thickness in the region, where the spatial shells contain data representing at least one property of the wear indicator.

2. The method of claim 1, wherein computing the arrangement of spatial shells comprises computing a sequence of nested spatial shells.

3. The method of claim 2, further comprising assigning different values of at least one property of the wear indicator to respective individual spatial shells of the nested spatial shells.

4. The method of claim 3, wherein the at least one property of the wear indicator is selected from among a color, a shape, an indicator label, a texture, a conductive characteristic, a magnetic characteristic, an acoustic characteristic, a chemical characteristic, and an elastic characteristic.

5. The method of claim 1, further comprising assigning varying material volume coverages (Mvocs) to respective voxels of the spatial shells, each Mvoc representing a probabilistic distribution of materials used by the printing system.

6. The method of claim 5, further comprising assigning Mvoc vectors to the respective voxels, wherein each respective Mvoc vector of the Mvoc vectors includes vector components corresponding to respective different states relating to print materials used by the 3D printing system.

7. The method of claim 1, wherein the spatial shells correspond to different levels within a 3D object represented by the 3D object data.

8. The method of claim 7, further comprising assigning different values of the at least one property to the different levels within the 3D object.

9. A system comprising:
a hardware processor to:
receive an input three-dimensional (3D) object model that is without a wear indicator;
determine a region of the input 3D object model in which to add the wear indicator, and
compute an arrangement of a number of spatial shells in the region, where each spatial shell contain data representing at least one property of the wear indicator.

10. The system of claim 9, wherein the hardware processor is to produce, based on the determining and the computing, an output 3D object model that includes the wear indicator.

11. The system of claim 10, wherein the output 3D object model includes a core and the number of spatial shells outside the core, and the hardware processor is to send the output 3D object model to a print processing pipeline to apply a first halftoning technique to the core and a second, different halftoning technique to the shell portion.

12. The system of claim 11, wherein the first halftoning technique or the second halftoning technique is applied to material volume coverage (Mvoc) vectors that each includes vector components representing states relating to combinations of print materials, wherein a given state of the states corresponds to an absence of the print materials.

13. The system of claim 11, wherein the print processing pipeline comprises:
a matrix halftoner to apply the first halftoning technique to the core; and
an error diffusion halftoner to apply the second, different halftoning technique to the shell portion.

14. The system of claim 11, wherein one of the number of spatial shells conforms to a shape of an outer profile of an object represented by the 3D object model.

15. The system of claim 11, wherein a thickness of one of the number of spatial shells is irregular.

16. The system of claim 11, wherein one of the number of spatial shells comprises electrical elements that are exposed in response to mechanical wear of an object represented by the 3D object model.

17. The system of claim 11, wherein one of the number of spatial shells comprises a chamber containing a chemical compound that is released in response to mechanical wear of an object represented by the 3D object model.

18. The system of claim 9, further comprising a non-transitory machine-readable storage medium storing instructions that upon execution cause the hardware processor to:
compute the arrangement of the number of spatial shells, the number of spatial shells being of variable thickness in a region of the 3D object data, wherein the spatial shells contain data representing at least one property of a wear indicator to be included in a 3D object produced by the 3D printing system; and
assign values of the at least one property to the number of spatial shells to define different characteristics of the wear indicator at different portions of the 3D object.

19. The system of claim 18, wherein the different portions of the 3D object comprise different levels and/or different locations in the 3D object.

20. A method comprising:
receiving, by a system comprising a processor, three-dimensional (3D) object data for printing a corresponding 3D object with a 3D printing system;
determining a region interior to the 3D object at which a wear indicator is to be formed; and
revising the 3D object data to include a region corresponding to the wear indicator so that that 3D object data can be used by the 3D printing system to manufacture the 3D object comprising the wear indicator,
wherein the region corresponding to the wear indicator comprises at least one property of the wear indicator that distinguishes the region of the wear indicator from surrounding areas not included in the wear indicator.

* * * * *